(12) United States Patent
Rahman et al.

(10) Patent No.: US 10,804,460 B2
(45) Date of Patent: Oct. 13, 2020

(54) DEVICE, SYSTEM AND METHOD FOR IMPROVED MAGNETIC ANISOTROPY OF A MAGNETIC TUNNEL JUNCTION

(71) Applicants: MD Tofizur Rahman, Portland, OR (US); Christopher J. Wiegand, Portland, OR (US); Brian Maertz, Santa Barbara, CA (US); Daniel G. Ouellette, Portland, OR (US); Kaan Oguz, Beaverton, OR (US); Brian S. Doyle, Portland, OR (US); Mark L. Doczy, Portland, OR (US); Daniel B. Bergstrom, Lake Oswego, OR (US); Justin S. Brockman, Portland, OR (US); Oleg Golonzka, Beaverton, OR (US); Tahir Ghani, Portland, OR (US); Intel Corporation, Santa Clara, CA (US)

(72) Inventors: MD Tofizur Rahman, Portland, OR (US); Christopher J. Wiegand, Portland, OR (US); Brian Maertz, Santa Barbara, CA (US); Daniel G. Ouellette, Portland, OR (US); Kevin P. O'Brien, Portland, OR (US); Kaan Oguz, Beaverton, OR (US); Brian S. Doyle, Portland, OR (US); Mark L. Doczy, Portland, OR (US); Daniel B. Bergstrom, Lake Oswego, OR (US); Justin S. Brockman, Portland, OR (US); Oleg Golonzka, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 16/097,801

(22) PCT Filed: Jul. 1, 2016

(86) PCT No.: PCT/US2016/040875
§ 371 (c)(1),
(2) Date: Oct. 30, 2018

(87) PCT Pub. No.: WO2018/004698
PCT Pub. Date: Jan. 4, 2018

(65) Prior Publication Data
US 2019/0140166 A1    May 9, 2019

(51) Int. Cl.
H01L 29/82    (2006.01)
H01L 43/12    (2006.01)
(Continued)

(52) U.S. Cl.
CPC ............ H01L 43/12 (2013.01); G11C 11/161 (2013.01); H01L 43/02 (2013.01); H01L 43/08 (2013.01); H01L 43/10 (2013.01)

(58) Field of Classification Search
CPC ......... H01L 29/82; H01L 43/08; H01L 43/10; H01L 43/12; H01F 10/14
See application file for complete search history.

(56) References Cited

U.S. PATENT DOCUMENTS

| 2008/0191295 A1* | 8/2008 | Ranjan | B82Y 25/00 257/421 |
| 2009/0303640 A1* | 12/2009 | Mizuno | B82Y 25/00 360/324 |

(Continued)

OTHER PUBLICATIONS

International Search Report and Written Opinion for International Patent Application No. PCT/US2016/040875 dated Mar. 9, 2017, 12 pgs.

(Continued)

*Primary Examiner* — Phuc T Dang
(74) *Attorney, Agent, or Firm* — Schwabe, Williamson & Wyatt, P.C.

(57) ABSTRACT

Material layer stack structures to provide a magnetic tunnel junction (MTJ) having improved perpendicular magnetic anisotropy (PMA) characteristics. In an embodiment, a free magnetic layer of the material layer stack is disposed between a tunnel barrier layer and a cap layer of magnesium oxide (Mg). The free magnetic layer includes a Cobalt-Iron-
(Continued)

Boron (CoFeB) body substantially comprised of a combination of Cobalt atoms, Iron atoms and Boron atoms. A first Boron mass fraction of the CoFeB body is equal to or more than 25% (e.g., equal to or more than 27%) in a first region which adjoins an interface of the free magnetic layer with the tunnel barrier layer. In another embodiment, the first Boron mass fraction is more than a second Boron mass fraction in a second region of the CoFeB body which adjoins an interface of the free magnetic layer with the cap layer.

25 Claims, 8 Drawing Sheets

(51) Int. Cl.
*H01L 43/08* (2006.01)
*H01L 43/10* (2006.01)
*G11C 11/16* (2006.01)
*H01L 43/02* (2006.01)

(56) References Cited

U.S. PATENT DOCUMENTS

| | | |
|---|---|---|
| 2014/0103469 A1 | 4/2014 | Jan et al. |
| 2014/0175575 A1* | 6/2014 | Doyle .................... H01L 43/08 |
| | | 257/421 |
| 2014/0308760 A1 | 10/2014 | Doyle et al. |
| 2015/0091110 A1 | 4/2015 | Kuo et al. |
| 2015/0194596 A1 | 7/2015 | Oguz et al. |
| 2015/0332748 A1 | 11/2015 | Wang et al. |

OTHER PUBLICATIONS

International Preliminary Report on Patentability for International Patent Application No. PCT/US2016/040875, dated Jan. 10, 2019, 9 pages.

* cited by examiner

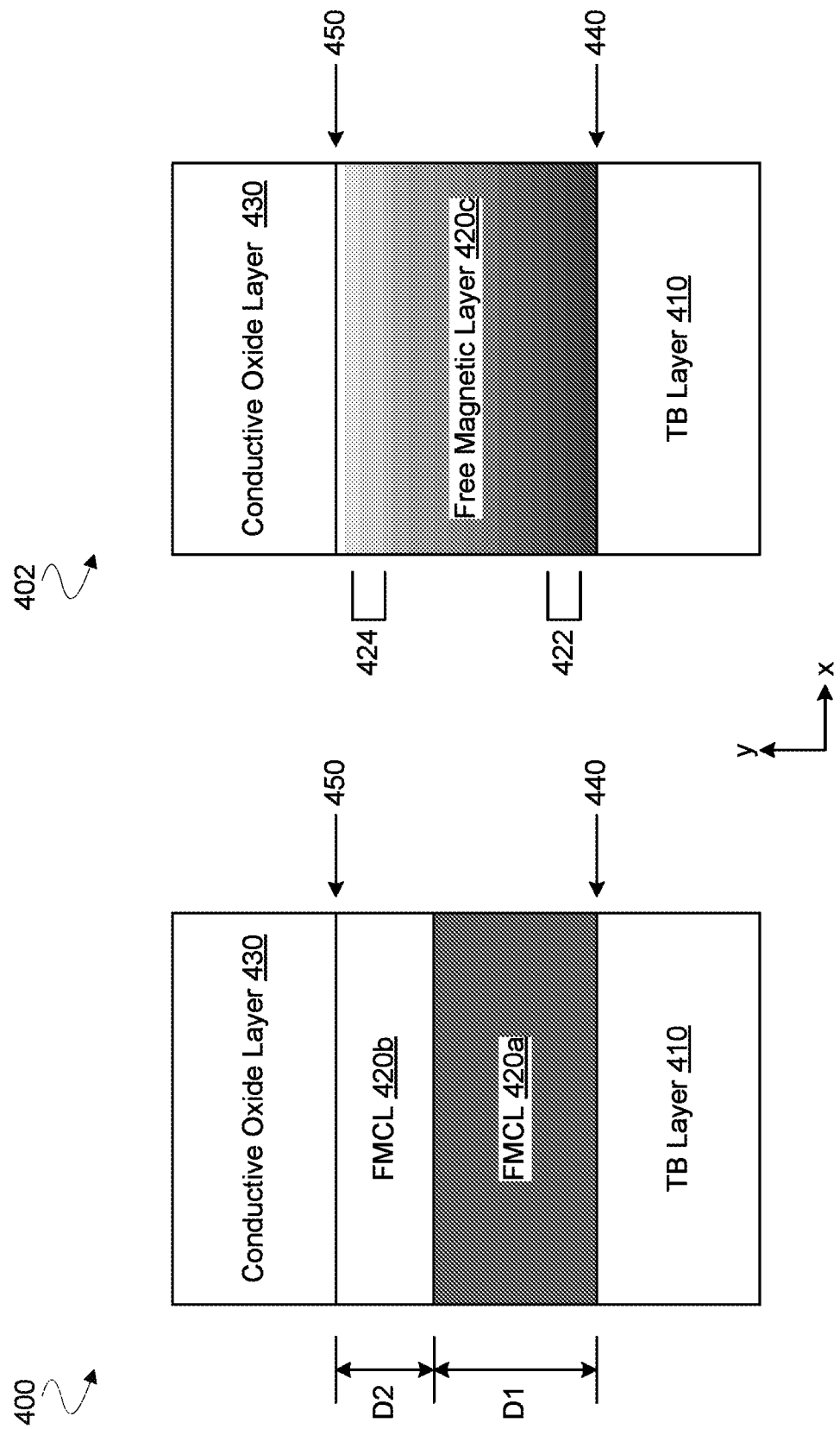

DEVICE, SYSTEM AND METHOD FOR IMPROVED MAGNETIC ANISOTROPY OF A MAGNETIC TUNNEL JUNCTION

CROSS-REFERENCE TO RELATED APPLICATION

This patent application is a U.S. National Phase Application under 35 U.S.C. § 371 of International Application No. PCT/US2016/040875, filed Jul. 1, 2016, entitled "DEVICE, SYSTEM AND METHOD FOR IMPROVED MAGNETIC ANISOTROPY OF A MAGNETIC TUNNEL JUNCTION," which designates the United States of America, the entire disclosure of which is hereby incorporated by reference in its entirety and for all purposes.

BACKGROUND

1. Technical Field

Embodiments described herein relate generally to magnetic tunnel junction devices and more particularly, but not exclusively, to techniques for providing a spin transfer torque memory (STTM) device.

2. Background Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will come out spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to higher switching yield provided by synthetic anti-ferromagnetic layers.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements. However, significant improvements are still needed in the area of STTM device manufacture and usage.

BRIEF DESCRIPTION OF THE DRAWINGS

The various embodiments of the present invention are illustrated by way of example, and not by way of limitation, in the figures of the accompanying drawings and in which:

FIGS. 4A, 4B illustrate cross-sectional views of material layer stacks each for a respective MTJ device according to a corresponding embodiment.

DETAILED DESCRIPTION

Magnetic tunnel junction (MTJ) devices with enhanced magnetic anisotropy characteristics, and methods of fabricating such MTJ devices, are described herein. In the following description, numerous specific details are set forth, such as specific magnetic layer integration and material regimes, in order to provide a thorough understanding of some embodiments. It will be apparent to one skilled in the art that other embodiments may be practiced without these specific details. In other instances, well-known features, such as integrated circuit design layouts, are not described in detail in order to not unnecessarily obscure embodiments of the present invention. Furthermore, it is to be understood that the various embodiments shown in the figures are illustrative representations and are not necessarily drawn to scale.

One or more embodiments are directed to methodologies for increasing or protecting perpendicular magnetic anisotropy (PMA) in a spin transfer torque memory (STTM) or other such MTJ device. Example applications for such methodologies include embedded memory, embedded non-volatile memory (NVM), magnetic random access memory (MRAM), NVM, perpendicular MTJ, STTM, and non-embedded or stand-alone memories. In an embodiment, PMA characteristics of a MTJ device are achieved by a particular Cobalt-Iron-Boron (CoFeB) metallurgy of a free layer, as is described in greater detail herein. PMA is one important issue facing scaling of MTJ based devices and memory arrays fabricated therefrom. As scaling continues, the need for smaller memory elements to fit into a scaled cell size has been limited by complications related to MTJ fabrication processes.

The technologies described herein may be implemented in one or more electronic devices such as in an Internet of Things (IOT). Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a memory comprising one or more material layer stacks each to provide a MTJ.

Figure 1:
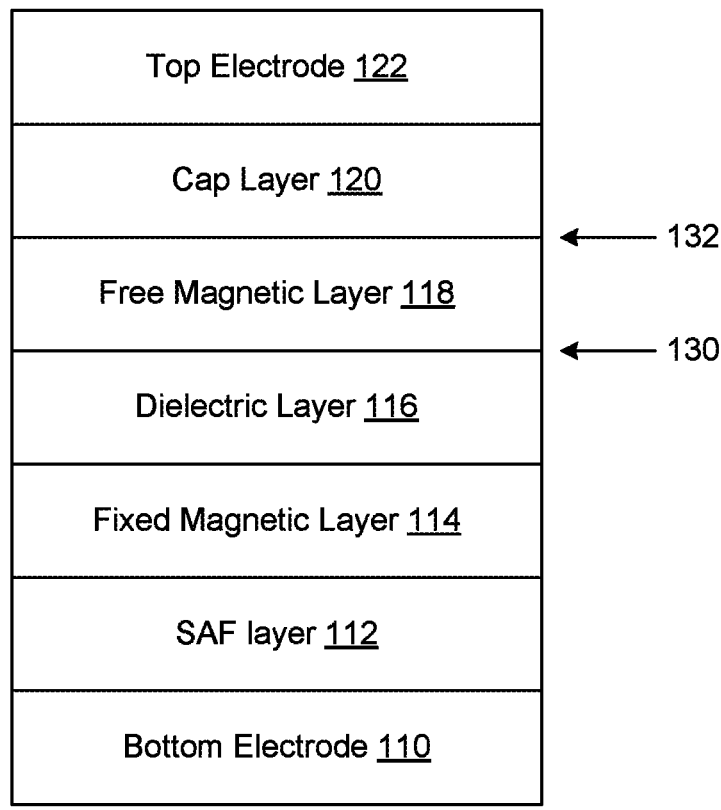
FIG. 1 is a functional block diagram illustrating a cross-sectional view of a material layer stack for a magnetic tunnel junction (MTJ) device according to an embodiment.

FIG. 1 illustrates a cross-sectional view of a material layer stack 100 of a STTM device according to an embodiment. Material layer stack 100 may include a bottom electrode 110, a fixed magnetic layer 114, a dielectric layer 116, a free magnetic layer 118 (or simply "free layer"), and a top electrode 112. A MTJ portion of the material layer stack 100 may include the fixed magnetic layer 114 (or simply "fixed layer"), the dielectric layer 116, and the free magnetic layer 118.

Material layer stack 100 is merely one example of a basic material layer stack for providing MTJ, which may be fabricated using additional and/or alternative combinations of material layers, in various embodiments. For example, although a synthetic antiferromagnetic (SAF) layer 112 is shown between bottom electrode 110 and fixed magnetic layer 114, some embodiments may omit SAF layer 112. Additionally or alternatively, electrodes 110 and 122 may themselves include multiple layers of material with differing properties.

The material layer stack 100 shown in FIG. 1 may provide a perpendicular spin system wherein spins of the magnetic layers 114, 118 are variously in respective planes that are perpendicular to the layers themselves. For example, a perpendicular spin component may be obtained from iron/cobalt (Fe/Co) in layer 118 interacting with oxygen in the dielectric layer 116—e.g., including interactions with magnesium oxide (MgO) of layer 116 at interface 130. Alternatively or in addition, a perpendicular spin component may be obtained from the iron/cobalt (Fe/Co) in the free magnetic layer 118 interacting with oxygen in the cap layer 120 (e.g., interacting with oxygen at interface 132). Such perpendicular spin may dominate over an in-plane component of the free magnetic layer 118.

The free magnetic layer 118 and the fixed magnetic layer 114 may be ferromagnetic layers. The dielectric layer 116, which separates the free magnetic layer 118 and the fixed magnetic layer 114, may have a thickness, e.g. a distance between the free magnetic layer 118 and the fixed magnetic layer 114 of about 1 nanometer or less, such that electrons can tunnel there through, if a bias voltage is applied between electrodes 110, 122.

In an embodiment, the MTJ functions essentially as a resistor, where the resistance of an electrical path through the MTJ may exist in two resistive states, either "high" or "low," depending on the direction or orientation of magnetization in the free magnetic layer 118 and in the fixed magnetic layer 114. In the case that the spin direction is to the down (minority) in the free magnetic layer 118, a high resistive state exists, wherein direction of magnetization in the free magnetic layer 118 and the fixed magnetic layer 114 are substantially opposed or anti-parallel with one another. In the case that the spin direction is up (majority) in the free magnetic layer 118, a low resistive state exists, wherein the direction of magnetization in the free magnetic layer 118 and the fixed magnetic layer 114 is substantially aligned or parallel with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the free magnetic layer 118 may be switched through a process call spin transfer torque (STT) using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layer 114. The electrons of the spin polarized current from the fixed magnetic layer 114 tunnel through the tunneling barrier or dielectric layer 116 and transfers its spin angular momentum to the free magnetic layer 118, wherein the free magnetic layer 118 will orient its magnetic direction from anti-parallel to that of the fixed magnetic layer 114 or parallel. The free magnetic layer 118 may be returned to its original orientation by reversing the current.

Thus, the MTJ may store a single bit of information ("0" or "1") by its state of magnetization. The information stored in the MTJ is sensed by driving a current through the MTJ. The free magnetic layer 118 does not require power to retain its magnetic orientations. As such, the state of the MTJ is preserved when power to the device is removed. Therefore, a spin transfer torque memory bit cell composed of the Mack 100 is, in an embodiment, non-volatile.

Fabricating of the material layer stack 100 may include one or more operations adapted from standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

One or both of electrodes 110, 122 may comprise tantalum (Ta) and/or any of various other suitable metals adapted from conventional STTM architectures. In an embodiment, one of both of electrodes 110, 122 is composed of a material or stack of materials suitable for electrically contacting the fixed magnetic layer side of a STTM device. In an embodiment, one of both of electrodes 110, 122 is a topographically smooth electrode. In one such embodiment, one of both of electrodes 110, 122 has a thickness suitable for good conductivity but has little to no columnar structure formation that would otherwise lead to a rough top surface. Such a topographically smooth electrode may be referred to as amorphous in structure. In a specific embodiment, the bottom electrode is composed of Ru layers interleaved with Ta layers. Effectively, in accordance with an embodiment of the present invention, one of both of electrodes 110, 122 may not be not a conventional thick single metal electrode, such as a Ru electrode, but is instead a Ru/Ta interleaved materials stack. In alternative embodiments, however, one of both of electrodes 110, 122 is a conventional thick single metal electrode, such as a Ru electrode.

In an embodiment, the fixed magnetic layer 114 is composed of a material or stack of materials suitable for maintaining a fixed majority spin. Thus, the fixed magnetic layer 114 (or reference layer) may be referred to as a ferromagnetic layer. In one embodiment, the fixed magnetic layer 114 is composed of a single layer of cobalt iron boron (CoFeB). However, in another embodiment, the fixed magnetic layer 114 is composed of a cobalt iron boron (CoFeB) layer, ruthenium (Ru) layer, cobalt/platinum (Co/Pt) multilayer stack. In a specific such embodiment, the fixed magnetic layer is in the form of a synthetic antiferromagnet (SAF). From a top down perspective, such a stack may include a CoFeB/Ru/CoFe/(Co/Pt)n stack or a CoFeR/Co/(Co/Pt)n/Co/Ru/Co/(Co/POn stack. It is to be understood that Ru thickness, e.g., 8-9 Angstroms, may facilitate anti-ferromagnetic (e.g., pointing in opposite directions) coupling between the CoFeB and the Co/Pt.

In an embodiment, the dielectric layer 116 is composed of a material suitable for allowing current of a majority spin to pass through the layer, while impeding at least to some extent current of a minority spin to pass through the layer. Thus, the dielectric layer 116 (or spin filter layer) may be referred to as a tunneling layer. In one embodiment, the dielectric layer 116 is composed of a material such as, but not limited to, magnesium oxide (MgO) or aluminum oxide ($Al_2O_3$). In one embodiment, the dielectric layer 116 has a thickness of approximately 1 nanometer. However, the particular dimensions of respective layers in material layer stack 100 may vary according to implementation specific details.

In an embodiment, the free magnetic layer 210 is composed of a material suitable for transitioning between a majority spin and a minority spin, depending on the application. Thus, the free magnetic layer 210 (or memory layer) may be referred to as a ferromagnetic memory layer. In one embodiment, the free magnetic layer 210 is composed of one or more layer of cobalt iron boron (CoFeB).

One common type of thermal degradation in perpendicular MTJ devices is the loss of perpendicular anisotropy (PMA). PMA is typically provided primarily by iron and oxygen hybridization at an interface of a free layer and a tunnel barrier layer. Some examples of physical characteristics that are based on, and thus indicative of, PMA include tunnel magneto-resistance ("TMR", or simply "MR") and resistance area product ("RA") which, for example, are related to read margin, low cell write current and thermal stability. Thermal annealing is one MTJ fabrication process that tends to degrade PMA (and, in turn, TMR and/or RA).

The presence of Boron (B) in a Cobalt-Iron (Co—Fe) alloy of a free layer tends to make the free layer more refractory—as compared to the case of pure Cobalt-Iron. This tendency would suggest that comparatively higher Boron (B) content is associated a free layer being relatively more thermally susceptible. However, some embodiments are based on a realization by the inventors that additional Boron (B)—at least for particular ranges and/or distributions in a free magnetic layer—increase a possibility that some Boron may migrate to an interface between the free magnetic layer and a tunnel barrier. These embodiments exploit a tendency of this type of Boron migration to form a thin boron oxide (BoO) layer at the tunnel barrier/free layer interface. Such a BoO layer tends to prevent or otherwise mitigate PMA degradation that might otherwise take place due to relatively high temperature thermal annealing processes.

In some embodiments, a free layer provides various levels of Boron mass fraction in different respective regions along a thickness of the free layer. For example, a free layer may exhibit a Boron mass fraction profile which varies—continuously or discontinuously—along the thickness of the free layer. Alternatively, a composite free layer according to an embodiment may include multiple constituent layers, each having a different respective Boron mass fraction level that is consistent throughout that constituent layer.

Figure 5:
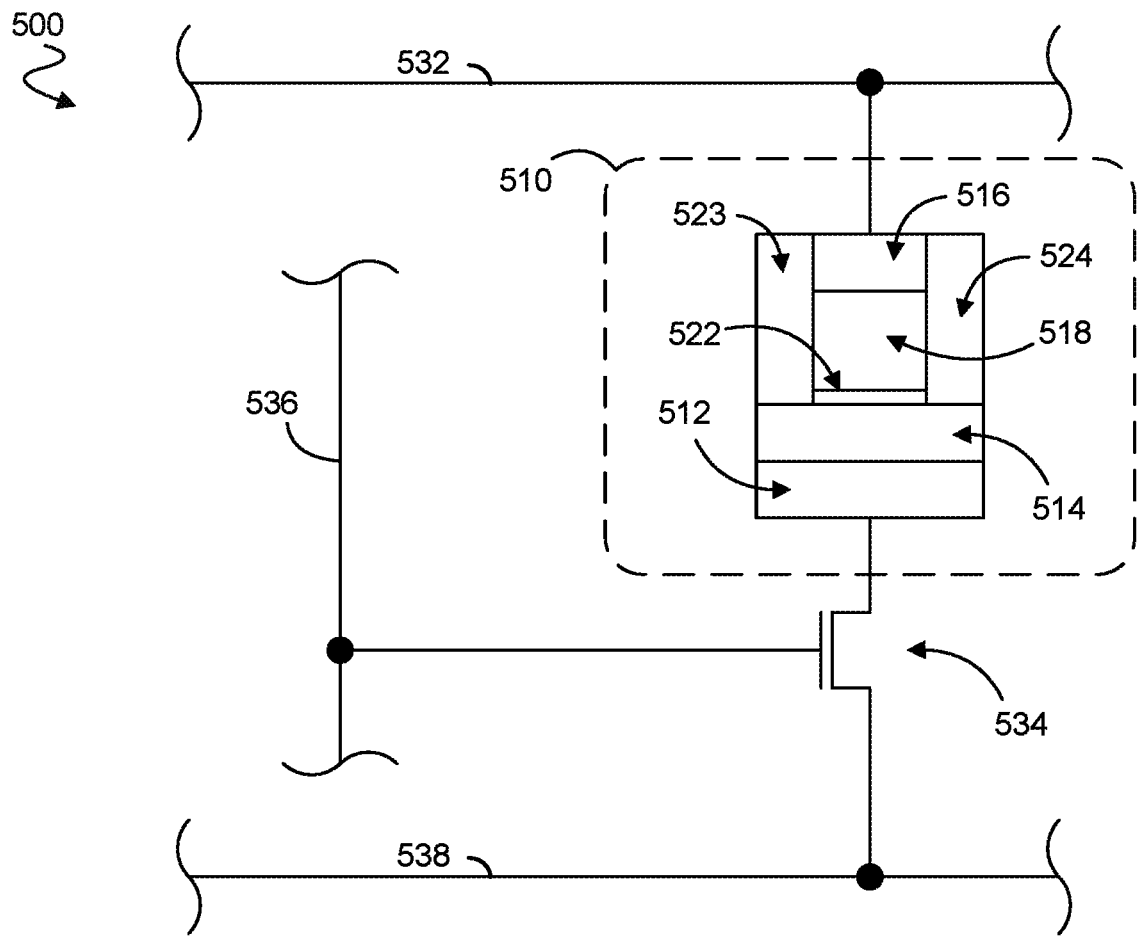
FIG. 5 is a schematic of a spin transfer torque memory bit cell which includes a spin transfer torque element according to an embodiment.

In an embodiment, as described in additional detail with respect to FIG. 5, a non-volatile memory device includes a first electrode and a fixed magnetic layer disposed above the first electrode. A free magnetic layer is disposed above the fixed magnetic layer, and a second electrode is disposed above the free magnetic layer. A dielectric layer is disposed between the free magnetic layer and the fixed magnetic layer. The second electrode includes an oxide layer that is adjacent the free magnetic layer, where the oxide layer is less electrically resistive than the free magnetic layer. The non-volatile memory device also includes a transistor electrically connected to the free magnetic layer electrode, a source line, and a word line.

In certain aspects and at least some embodiments, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunnel magneto-resistance effect while applying voltage to the output electrodes. In an embodiment, the role of the dielectric layer 116 is to cause a large magneto-resistance. The magneto-resistance is the ratio of the difference between resistances when the two ferromagnetic layers have anti-parallel magnetizations and the resistance of the state with the parallel magnetizations.

Figure 2:
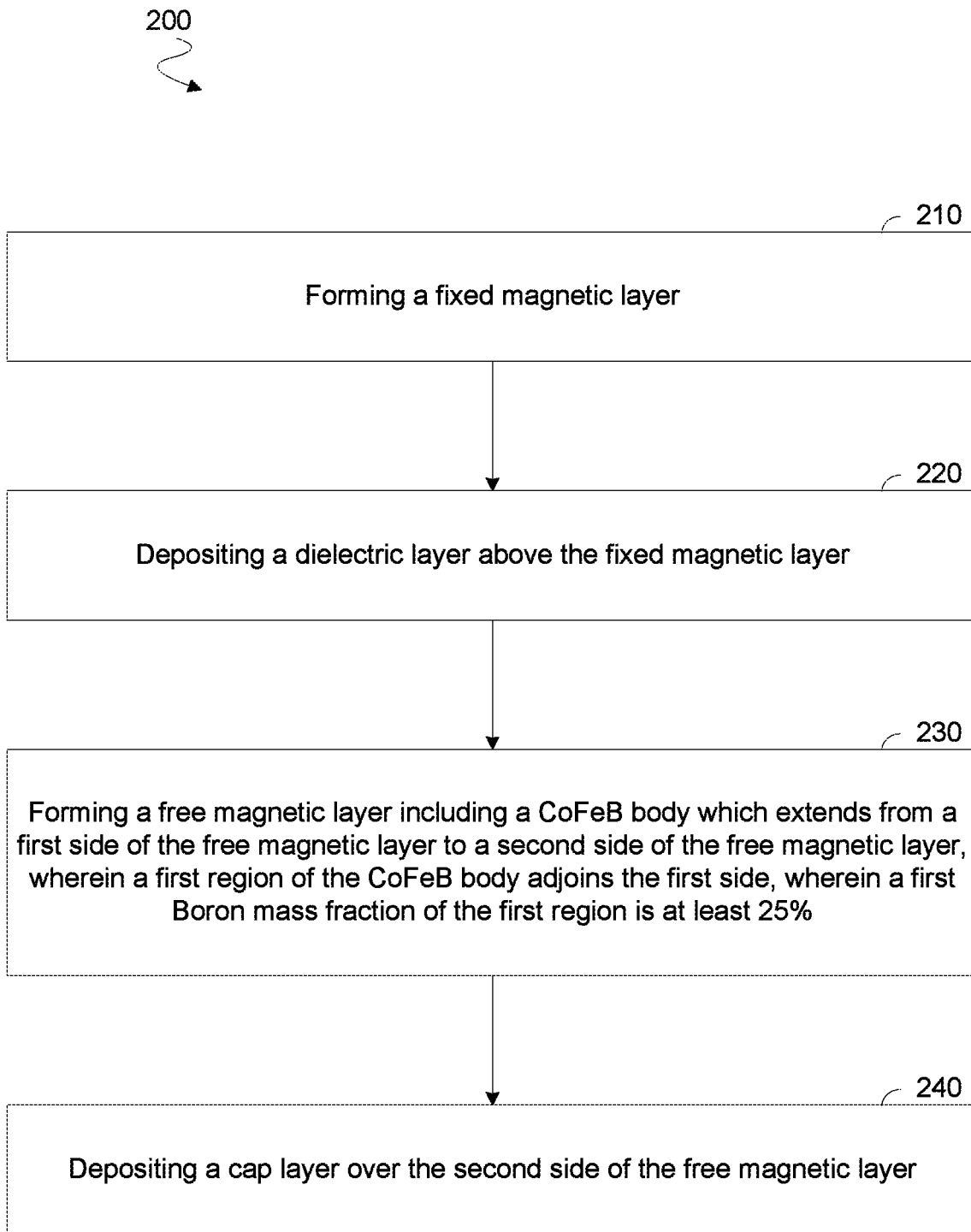
FIG. 2 is a flow diagram illustrating elements of a method to provide a MTJ device according to an embodiment.

FIG. 2 illustrates elements a method 200 to provide functionality of a magnetic tunnel junction according to an embodiment. Method 200 is one example embodiment of processing to provide structure having some or all of the features of material layer stack 100, for example. Any of a variety of conventional fabrication techniques—e.g., including, but not limited to, deposition (e.g., sputter), patterning (e.g., lithographic), atomic layer deposition (ALD) and etch (e.g., dry or wet) processes known in the art for MTJ stack fabrication—may be adapted to variously form certain structures of a material layer stack according to an embodiment. Such conventional techniques are not detailed herein to avoid obscuring features of various embodiments.

Method 200 may include, at 210, forming a fixed magnetic layer such as fixed magnetic layer 114 of material layer stack. The fixed magnetic layer formed at 210 may include one or more ferromagnetic materials, and may be relatively thick—e.g., as compared to a free magnetic layer also formed by method 200. In an embodiment, method 200 further comprises, at 220, depositing a dielectric layer above the fixed magnetic layer. The dielectric layer (such as dielectric layer 116) may be formed, for example, by deposition of magnesium oxide (MgO), and may be provided to function as a tunnel barrier layer of a MTJ.

Method 200 may further comprise, at 230, forming a free magnetic layer including a Cobalt-Iron-Boron (CoFeB) body which extends from a first side of the free magnetic layer to a second side of the free magnetic layer. In an embodiment, the free magnetic layer is coupled to the dielectric layer via the first side—e.g., at interface 130. As used herein, "Cobalt-Iron-Boron body" (or "CoFeB body") refers to a contiguous region of material, wherein substantially all (more than 95%) material in the region is comprised of a combination of Cobalt atoms, Iron atoms and Boron atoms. For brevity, "CoFeB-based" is used herein to refer to a free magnetic layer which includes a CoFeB body.

For any given region of such a CoFeB body, the region may have a particular mass fraction of Boron as a fraction of all Cobalt (Co), Iron (Fe) and (Boron) of the region. Such a mass fraction is referred to herein as a "Boron mass fraction." Although some embodiments are not limited in this regard, a CoFeB body may exhibit a Boron mass fraction gradient, wherein the Boron mass fraction changes along a thickness or other direction of the free magnetic layer.

In some embodiments, the Boron mass fraction of a CoFeB body is relatively high (as compared to conventional MTJ architectures) at least in a region at or near an interface of a free magnetic layer and a tunnel barrier layer. By way of illustration and not limitation, a first region of the CoFeB body formed at 230 may include or otherwise adjoin the first side of the free magnetic layer—e.g., wherein a first Boron mass fraction of the first region is at least 25%. In an embodiment, such a first Boron mass fraction may be at least 27% (e.g., at least 30%). For example, the first Boron mass fraction may be in a range of 25% to 40% (for example, in a range of 27% to 35% and, in some embodiments, in a range of 29% to 31%).

Alternatively or in addition, a Boron mass fraction of the entire CoFeB body may be at least 25%. For example, such a Boron mass fraction of the entire CoFeB body may be at least 27% (and in some embodiments, at least 29%). In an embodiment, the Boron mass fraction of the entire CoFeB body is in a range of 25% to 40% (e.g, in a range of 27% to 35% and, in some embodiments, in a range of 29% to 31%).

The CoFeB body may further include a second region, wherein the first Boron mass fraction is at least 15% more (e.g., at least 25% more) than a second Boron mass fraction of the second region. The second region may include or otherwise adjoin the second side of the free magnetic layer, for example. In one illustrative embodiment, the first Boron mass fraction is at least 50% more than the second Boron mass fraction (e.g., wherein the first Boron mass fraction is 30% and the second Boron mass fraction is 20%). In one illustrative embodiment, a ratio of Co to Fe (Co:Fe ratio) of the CoFeB body is 50%-50%. In another embodiment, the Co:Fe ratio the CoFeB body is between 60:40 and 40:60. However, the Co:Fe ratio may vary in different embodiments, according to implementation specific details.

A Boron mass fraction gradient of the CoFeB body may be zero—i.e., with no change in Boron mass fraction along a line such as a thickness dimension extending through the first side and the second side. Alternatively, at least some portion of the CoFeB body may have a non-zero Boron mass fraction gradient that is constant along the thickness dimension. In some embodiments, the Boron mass fraction gradient varies—e.g., continuously or discontinuously—along a thickness of the free magnetic layer. For example, formation of the free magnetic layer at 230 may include forming a composite CoFeB body including a first constituent CoFeB layer and a second constituent CoFeB layer. The first and second constituent CoFeB layers may have each have different respective Boron mass fractions—e.g., wherein both constituent layers have zero Boron mass fraction gradients. In such an embodiment, the Boron mass fraction gradient of the composite CoFeB body may include a step transition, at an interface of the first constituent CoFeB layer and the second constituent CoFeB layer, between the first Boron mass fraction and a second Boron mass fraction.

In some embodiments, method 200 includes one or more additional processes to build the material layer and/or to couple the material layer to other circuitry such as that of a non-volatile memory device which is to include the MTJ. For example, method 200 may further comprise, at 240, depositing a cap layer over the second side, the cap layer including an oxide material—such as magnesium oxide (MgO)—that is less electrically resistive than the free magnetic layer. The cap layer may prevent out-diffusion of Boron from the free magnetic layer during a subsequent thermal anneal processing (not shown) that is part of, or may be performed after, method 200.

As described elsewhere herein, TMR and RA are based on, and indicative of, PMA. As used herein, "tunnel magneto-resistance" (sometimes referred to as "tunnel magneto-resistance ratio") refers to the ratio [(R1−R2)/R2], where R1 an electrical resistance of a MTJ while it is in an anti-parallel magnetic orientation state, and R2 is an electrical resistance of that MTJ while it is in a parallel magnetic orientation state. "Resistance area product" refers herein to a product of a cross-sectional area of a circuit structure (e.g., a MTJ) and an electrical resistance of that circuit structure.

Figure 3A:
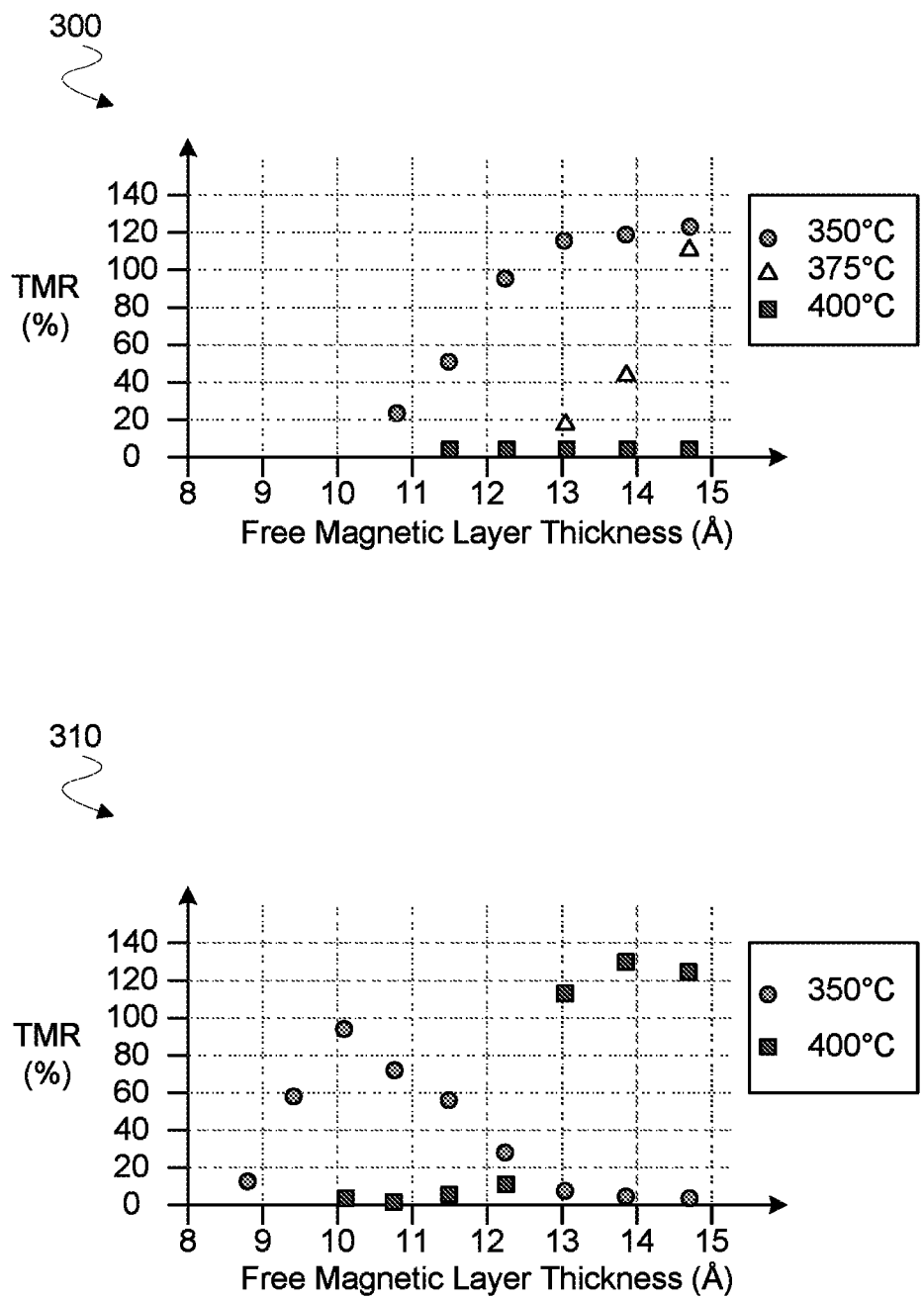
FIGS. 3A, 3B show graphs illustrating comparative features of respective MTJ devices each according to a corresponding embodiment.
Figure 3B:
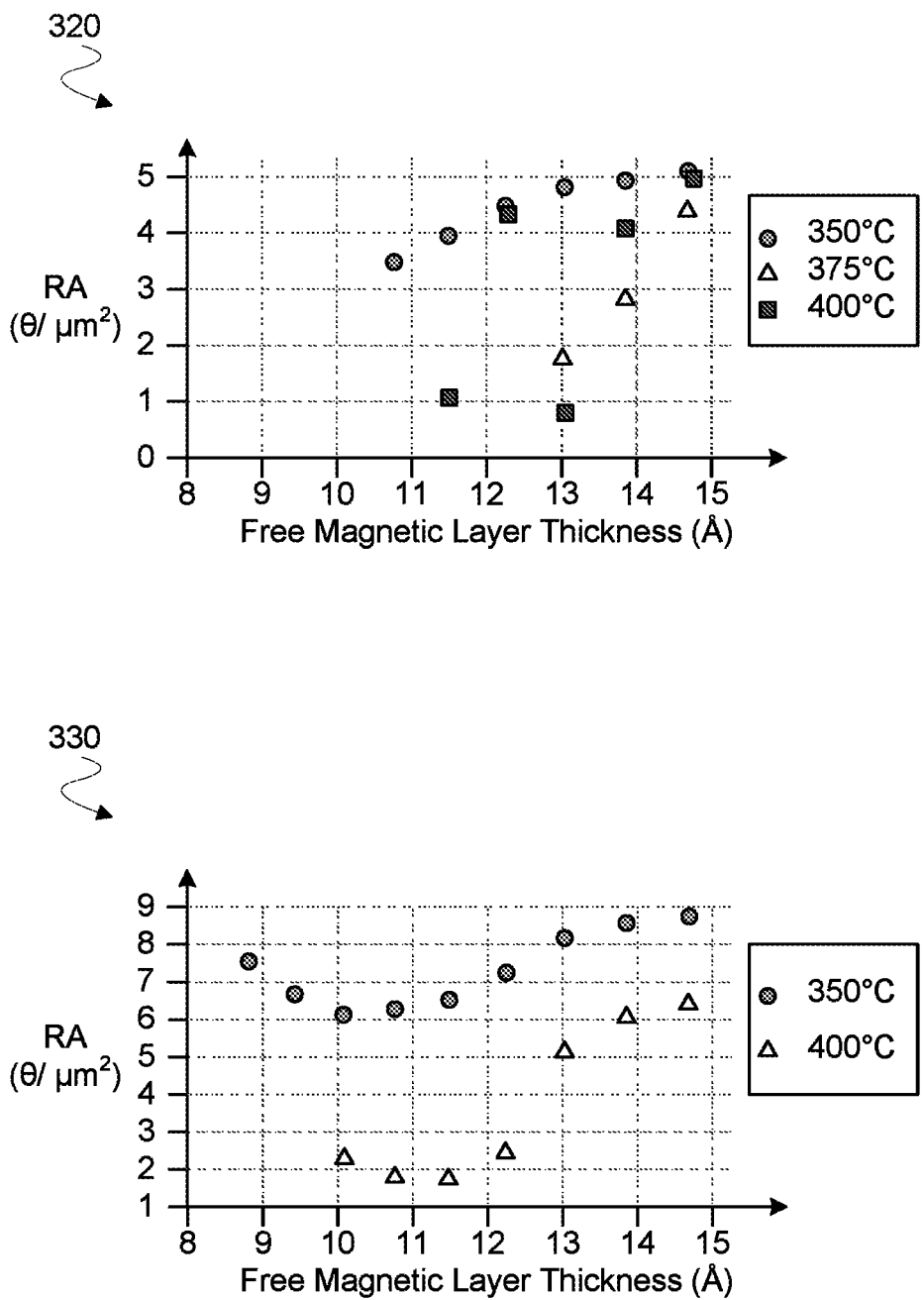

FIGS. 3A, 3B show various graphs 300, 310, 320, 330 to illustrate comparative features of material layer stacks according to different embodiments. More particularly, graph 300 shows plots of TMR values for free magnetic layers having various thicknesses, the free magnetic layers having been variously processed by thermal annealing at respective temperatures (in this case, one of 350° C., 375° C. and 400° C.). The plots shown in graph 300 variously represent CoFeB-based free magnetic layers each having a Boron mass fraction of 20%. Graph 310 plots TMR values similar to those of graph 300, except wherein the plots correspond to CoFeB-based free magnetic layers that, according to respective embodiments, each have a Boron mass fraction of 30%.

Graph 320 includes plots—across a range of free magnetic layer thicknesses and for different thermal anneal temperatures—of resistance area product (RA) values for CoFeB-based free magnetic layers each having a Boron mass fraction of 20%. Graph 330 plots RA values similar to those of graph 320, except wherein the plots correspond to CoFeB-based free magnetic layers that, according to respective embodiments, each have a Boron mass fraction of 30%. Good performance of a STTM (or other device including a MTJ) is typically associated with a combination of relatively small RA and relatively large TMR. As shown in graph 300, higher temperatures of thermal annealing and smaller thicknesses of a free magnetic layer both tend to result in reduced TMR of a MJT. A comparison of graphs 320, 330 to one another shows that a Boron mass factor of a free layer according to an embodiment may be associated with a somewhat large RA of a MTJ. However, as shown by a comparison of graphs 300, 310, such RA characteristics may be offset by good TMR values—e.g., for significantly thinner free layers and/or significantly higher thermal anneal temperatures.

FIGS. 4A, 4B show respective material layer stacks 400, 402 each to provide MTJ functionality according to a corresponding embodiment. Material layer stack 400 and/or material layer stack 402 may include one or more features of material layer stack 100, for example. In an embodiment, manufacture of material layer stack 400 and/or material layer stack 402 may be according to method 200.

As shown in FIG. 4A, material layer stack 400 may include a free magnetic layer (such as free magnetic layer 118) which includes a first side and a second side (at respective levels 440, 450). A tunnel barrier (TB) layer 410 (such as dielectric layer 116) may be coupled to the free magnetic layer via the first side—e.g., wherein a relatively less resistive oxide layer 430 (e.g., cap layer 120) is further coupled via the second side to the free magnetic layer. In an embodiment, a CoFeB body extends the entire thickness of the free magnetic layer to each of levels 440, 450.

By way of illustration and not limitation, the illustrative free magnetic layer of material layer stack 400 is shown as a composite layer including constituent layers FMCL 420a, FMCL 420b. A Boron mass fraction gradient of such a free layer may change at an interface between FMCL 420a and FMCL 420b. For example, FMCL 420a and FMCL 420b may have different respective Boron mass fractions and/or different respective Boron mass fraction gradients. At or near level 440, FMCL 420a may provide a Boron mass fraction which is larger (e.g., by at least 15%) than a Boron mass fraction for at least some portion of FYICL 420b. Although some embodiments are not limited in this regard, a thickness D1 of FMCL 420a may be different than a thickness D2 of FMCL 420b. For example, D1 may be more than twice D2—e.g., wherein D1 is 4.5 Angstroms (Å) and D2 is 10 Å. However, such thickness dimensions are merely illustrative, and may vary according to implementation specific details.

In the illustrative embodiment of material layer stack 402, a free magnetic layer 420c forms a first side and second side (at respective levels 440, 450) that interface with TB layer 410 and less resistive oxide layer 430, respectively. A Boron mass fraction of free magnetic layer 420c may change along a thickness thereof—e.g., wherein a first Boron mass fraction in a region 422 is more than a second Boron mass fraction in a region 424 that is relatively farther from level 440. Free magnetic layer 420c may exhibit a Boron mass fraction gradient which, for example, is substantially constant (e.g., within 5% of an average gradient value) along a thickness dimension that passes through levels 440, 450. In one embodiment, free magnetic layer 420c results from thermal anneal processing of material layer stack 400. For example, such annealing may result in Boron migration that reduces a differential between respective Boron mass factors of FMCL 420a and FMCL 420b.

A stack of layers including magnetic material layers and a less resistive oxide layer, e.g., which are used in a magnetic tunneling junction, may be used to fabricate as memory bit cell. For example, FIG. 5 illustrates a schematic of a spin transfer torque memory bit cell 500 which includes a spin transfer torque element 510, in accordance with an embodiment. Spin transfer torque element 510 may include some or all features of material layer stack layer 100, for example.

Referring to FIG. 5, the spin transfer torque element 510 may include a free magnetic layer electrode 512 with a free magnetic layer 514 adjacent the free magnetic layer electrode 512, a fixed magnetic layer electrode 516 adjacent a fixed magnetic layer 518, and a tunneling barrier or dielectric layer 522 disposed between the free magnetic layer 514 and the fixed magnetic layer 518. In an embodiment, the free magnetic layer electrode 512 includes an oxide layer adjacent to (and less resistive than) the free magnetic layer 514. In an embodiment, the spin transfer torque element 510 is based on perpendicular magnetism.

Alternatively or in addition, a first dielectric element 523 and a second dielectric element 524 may be formed, for example, adjacent the fixed magnetic layer electrode 516, the fixed magnetic layer 518, and the tunneling barrier or dielectric layer 522. The fixed magnetic layer electrode 516 may be electrically connected to a bit line 532. The free magnetic layer electrode 512 may be coupled with a transistor 534. The transistor 534 may be coupled with a word line 536 and a source line 538 in a manner that will be understood to those skilled in the art. The spin transfer torque memory bit cell 500 may further include additional read and write circuitry (not shown), a sense amplifier (not shown), a bit line reference (not shown), and the like, as will be understood by those skilled in the art, for the operation of the spin transfer torque memory bit cell 500. It is to be understood that a plurality of the spin transfer torque memory bit cells 500 may be operably connected to one another to form a memory array (not shown), wherein the memory array can be incorporated into a non-volatile memory device. It is to be understood that the transistor 534 may be connected to the fixed magnetic layer electrode 516 or the free magnetic layer electrode 512, although only the latter is shown.

Figure 6:
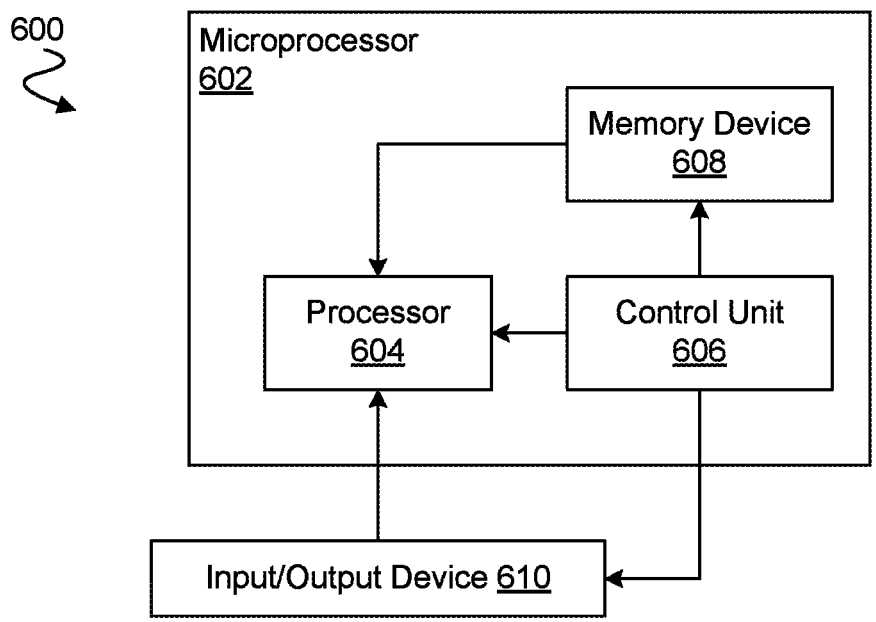
FIG. 6 illustrates a block diagram of an electronic system according to an embodiment.

FIG. 6 illustrates a block diagram of an electronic system 600, in accordance with an embodiment. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be understood that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a spin transfer torque element as described in the present description. In an embodiment, the memory device 608 is embedded in the microprocessor 602, as depicted in FIG. 6.

Figure 7:
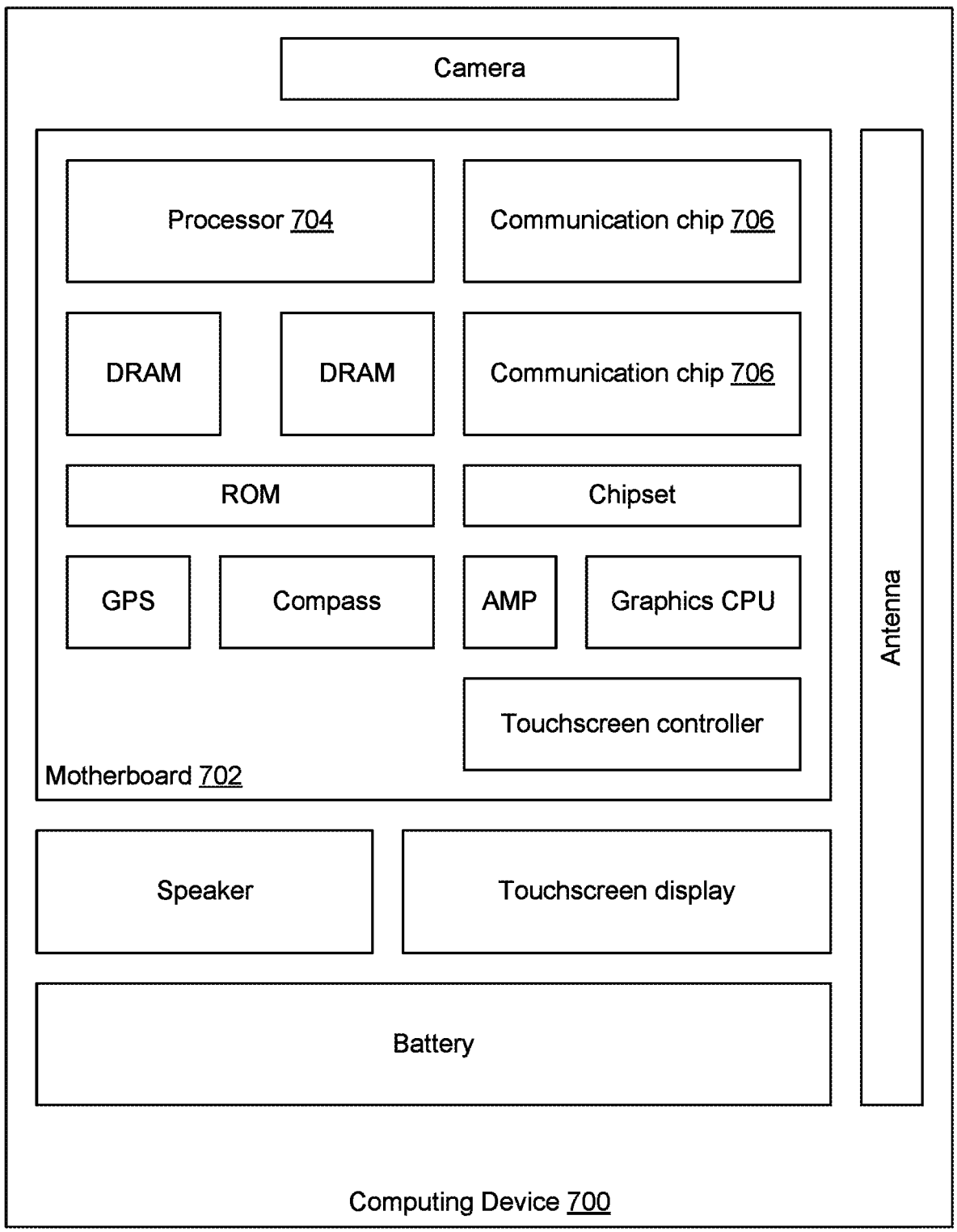
FIG. 7 is a functional block diagram illustrating elements of a computing device in accordance with one embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DM), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (WEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as spin transfer torque memory built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as spin transfer torque memory built in accordance with implementations of the invention.

In further implementations, another component housed within the computing device 700 may contain an integrated circuit die that includes one or more devices, such as spin transfer torque memory built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Accordingly, one or more embodiments of the present invention relate generally to the fabrication of microelectronic memory. The microelectronic memory may be non-volatile, wherein the memory can retain stored information even when not powered. One or more, embodiments of the present invention relate to the fabrication of a perpendicular spin transfer torque memory element for non-volatile microelectronic memory devices. Such an element may be used in an embedded non-volatile memory, either for its non-volatility, or as a replacement for embedded dynamic random access memory (eDRAM). For example, such an element may be used for 1T-1X memory (X=capacitor or resistor) at competitive cell sizes within a given technology node.

Thus, embodiments of the present invention include perpendicular spin transfer torque memory (STTM) devices with enhanced stability and methods of fabricating perpendicular STTM devices with enhanced stability.

Figure 8:
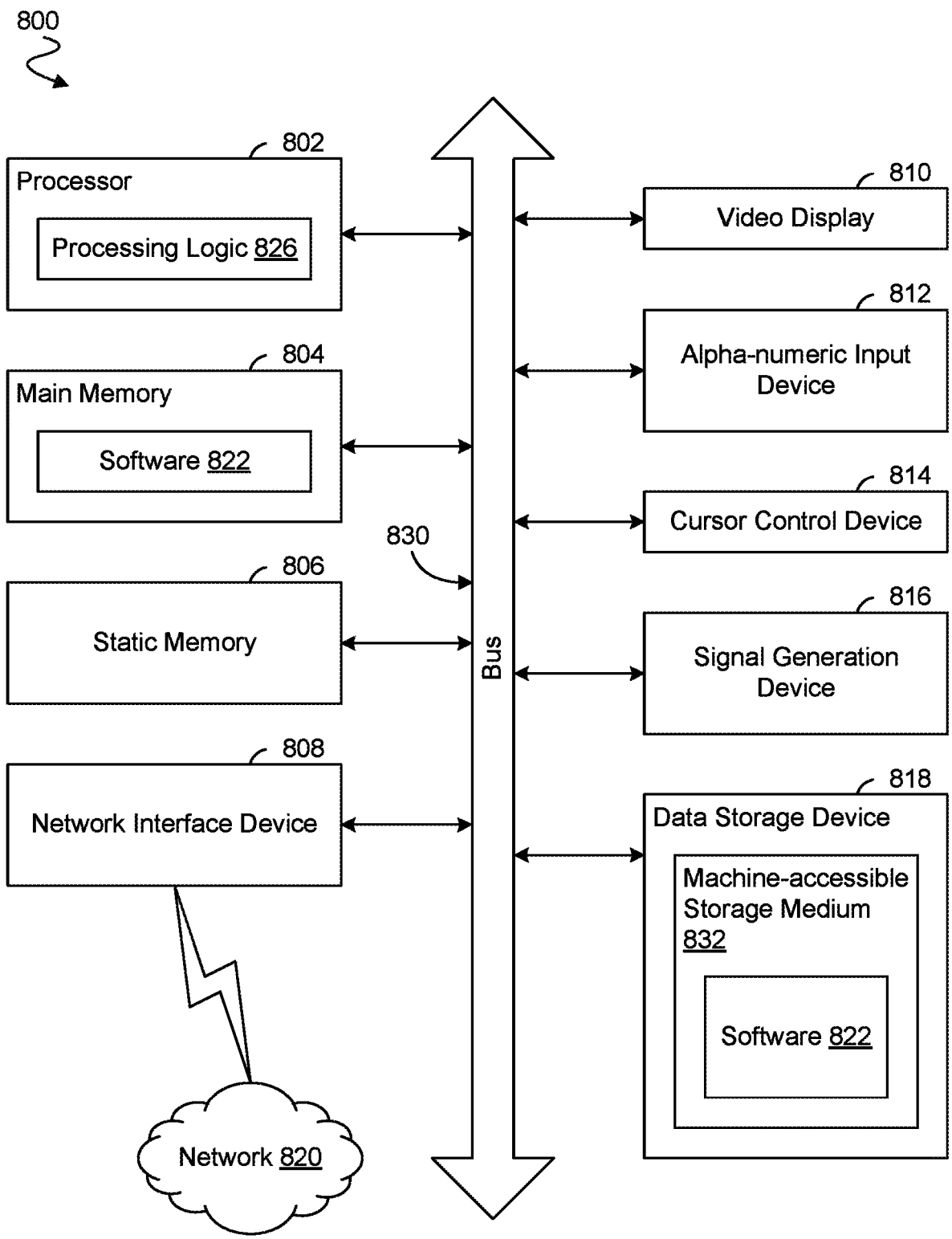
FIG. 8 is a functional block diagram illustrating elements of an exemplary computer system, in accordance with an embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions.

The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a material layer stack for a magnetic tunneling junction comprises a fixed magnetic layer, a dielectric layer disposed above the fixed magnetic layer, a free magnetic layer including a Cobalt-Iron-Boron (CoFeB) body which extends from a first side of the free magnetic layer to a second side of the free magnetic layer, the free magnetic layer coupled to the dielectric layer via the first side, wherein a first region of the CoFeB body adjoins the first side, wherein a first Boron mass fraction of the first region is at least 25%, and a cap layer including an oxide material, the cap layer coupled to the free magnetic layer via the second side.

In one embodiment, the first Boron mass fraction is at least 27%. In another embodiment, the first Boron mass fraction is in a range of 25% to 40%. In another embodiment, a Boron mass fraction of the entire CoFeB body is at least 25%. In another embodiment, the CoFeB body includes the first region and a second region, wherein the first Boron mass fraction is at least 25% more than a second Boron mass fraction of a second region of the CoFeB body. In another embodiment, the first Boron mass fraction is at least 50% more than the second Boron mass fraction. In another embodiment, the second region adjoins the second side. In another embodiment, a Boron mass fraction gradient of the CoFeB body varies along a thickness of the free magnetic layer. In another embodiment, the free magnetic layer is a composite layer including a first constituent CoFeB layer and a second constituent CoFeB layer, wherein the Boron mass fraction gradient includes a step transition, at an interface of the first constituent CoFeB layer and the second constituent CoFeB layer, between the first Boron mass fraction and a second Boron mass fraction.

In another implementation, a non-volatile memory device comprises a bottom electrode, a fixed magnetic layer disposed above the bottom electrode, a dielectric layer disposed above the fixed magnetic layer, and a free magnetic layer including a Cobalt-Iron-Boron (CoFeB) body which extends from a first side of the free magnetic layer to a second side of the free magnetic layer, the free magnetic layer coupled to the dielectric layer via the first side, wherein a first region of the CoFeB body adjoins the first side, wherein a first Boron mass fraction of the first region is at least 25%. The non-volatile memory device further comprises a cap layer including an oxide material, the cap layer coupled to the free magnetic layer via the second side, a top electrode disposed above the cap layer, and a transistor electrically connected to a source line, to a word line and to the top electrode or the bottom electrode.

In one embodiment, the first Boron mass fraction is at least 27%. In another embodiment, the first Boron mass fraction is in a range of 25% to 40%. In another embodiment, a Boron mass fraction of the entire CoFeB body is at least 25%. In another embodiment, the CoFeB body includes the first region and a second region, wherein the first Boron mass fraction is at least 25% more than a second Boron mass fraction of a second region of the CoFeB body. In another embodiment, the first Boron mass fraction is at least 50% more than the second Boron mass fraction. In another embodiment, the second region adjoins the second side. In another embodiment, a Boron mass fraction gradient of the CoFeB body varies along a thickness of the free magnetic layer. In another embodiment, the free magnetic layer is a composite layer including a first constituent CoFeB layer and a second constituent CoFeB layer, wherein the Boron mass fraction gradient includes a step transition, at an interface of the first constituent CoFeB layer and the second constituent CoFeB layer, between the first Boron mass fraction and a second Boron mass fraction.

In another implementation, a method for fabricating a material layer stack, the method comprises forming a fixed magnetic layer, depositing a dielectric layer above the fixed magnetic layer, forming a free magnetic layer including a Cobalt-Iron-Boron (CoFeB) body which extends from a first side of the free magnetic layer to a second side of the free magnetic layer, wherein the free magnetic layer is coupled to the dielectric layer via the first side, wherein a first region of the CoFeB body adjoins the first side, wherein a first average Boron concentration of the first region is at least 25%, and depositing a cap layer over the second side of the free magnetic layer, the cap layer including an oxide material.

In one embodiment, the first average Boron concentration is at least 27%. In another embodiment, the first average Boron concentration is in a range of 25% to 40%. In another embodiment, an average Boron concentration of the entire CoFeB body is at least 25%. In another embodiment, the CoFeB body includes the first region and a second region, wherein the first average Boron concentration is at least 25% more than a second average Boron concentration of a second region of the CoFeB body. In another embodiment, the first average Boron concentration is at least 50% more than the second average Boron concentration. In another embodiment, the second region adjoins the second side. In another embodiment, a Boron concentration gradient of the CoFeB body varies along a thickness of the free magnetic layer. In another embodiment, the free magnetic layer is a composite layer including a first constituent CoFeB layer and a second constituent CoFeB layer, wherein the Boron concentration gradient includes a step transition, at an interface of the first constituent CoFeB layer and the second constituent CoFeB layer, between the first average Boron concentration and a second average Boron concentration.

Techniques and architectures for providing a spin transfer torque memory are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMS) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A material layer stack for a magnetic tunneling junction, the material layer stack comprising:
    a fixed magnetic layer;
    a dielectric layer disposed above the fixed magnetic layer;
    a free magnetic layer including a Cobalt-Iron-Boron (CoFeB) body which extends from a first side of the free magnetic layer to a second side of the free magnetic layer, the free magnetic layer coupled to the dielectric layer via the first side, wherein a first region of the CoFeB body adjoins the first side, wherein a first Boron mass fraction of the first region is at least 25%; and
    a cap layer including an oxide material, the cap layer coupled to the free magnetic layer via the second side.

2. The material layer stack of claim 1, wherein the first Boron mass fraction is at least 27%.

3. The material layer stack of claim 1, wherein the first Boron mass fraction is in a range of 25% to 40%.

4. The material layer stack of claim 1, wherein a Boron mass fraction of the entire CoFeB body is at least 25%.

5. The material layer stack of claim 1, wherein the CoFeB body includes the first region and a second region, wherein the first Boron mass fraction is at least 25% more than a second Boron mass fraction of a second region of the CoFeB body.

6. The material layer stack of claim 5, wherein the first Boron mass fraction is at least 50% more than the second Boron mass fraction.

7. The material layer stack of claim 6, wherein the second region adjoins the second side.

8. The material layer stack of claim 1, wherein a Boron mass fraction gradient of the CoFeB body varies along a thickness of the free magnetic layer.

9. The material layer stack of claim 8, wherein the free magnetic layer is a composite layer including a first constituent CoFeB layer and a second constituent CoFeB layer, wherein the Boron mass fraction gradient includes a step transition, at an interface of the first constituent CoFeB layer and the second constituent CoFeB layer, between the first Boron mass fraction and a second Boron mass fraction.

10. A non-volatile memory device comprising:
    a bottom electrode;
    a fixed magnetic layer disposed above the bottom electrode;
    a dielectric layer disposed above the fixed magnetic layer;
    a free magnetic layer including a Cobalt-Iron-Boron (CoFeB) body which extends from a first side of the free magnetic layer to a second side of the free magnetic layer, the free magnetic layer coupled to the dielectric layer via the first side, wherein a first region of the CoFeB body adjoins the first side, wherein a first Boron mass fraction of the first region is at least 25%; and
    a cap layer including an oxide material, the cap layer coupled to the free magnetic layer via the second side;
    a top electrode disposed above the cap layer; and
    a transistor electrically connected to a source line, to a word line and to the top electrode or the bottom electrode.

11. The non-volatile memory device of claim 10, wherein the first Boron mass fraction is at least 27%.

12. The non-volatile memory device of claim 10, wherein the first Boron mass fraction is in a range of 25% to 40%.

13. The non-volatile memory device of claim 10, wherein a Boron mass fraction of the entire CoFeB body is at least 25%.

14. The non-volatile memory device of claim 10, wherein the CoFeB body includes the first region and a second region, wherein the first Boron mass fraction is at least 25% more than a second Boron mass fraction of a second region of the CoFeB body.

15. The non-volatile memory device of claim 14, wherein the first Boron mass fraction is at least 50% more than the second Boron mass fraction.

16. The non-volatile memory device of claim 14, wherein the second region adjoins the second side.

17. The non-volatile memory device of claim 10, wherein a Boron mass fraction gradient of the CoFeB body varies along a thickness of the free magnetic layer.

18. The non-volatile memory device of claim 17, wherein the free magnetic layer is a composite layer including a first constituent CoFeB layer and a second constituent CoFeB layer, wherein the Boron mass fraction gradient includes a step transition, at an interface of the first constituent CoFeB layer and the second constituent CoFeB layer, between the first Boron mass fraction and a second Boron mass fraction.

19. A method for fabricating a material layer stack, the method comprising:
  forming a fixed magnetic layer;
  depositing a dielectric layer above the fixed magnetic layer;
  forming a free magnetic layer including a Cobalt-Iron-Boron (CoFeB) body which extends from a first side of the free magnetic layer to a second side of the free magnetic layer, wherein the free magnetic layer is coupled to the dielectric layer via the first side, wherein a first region of the CoFeB body adjoins the first side, wherein a first average Boron concentration of the first region is at least 25%; and
  depositing a cap layer over the second side of the free magnetic layer, the cap layer including an oxide material.

20. The method of claim 19, wherein the first average Boron concentration is at least 27%.

21. The method of claim 19, wherein the first average Boron concentration is in a range of 25% to 40%.

22. The method of claim 19, wherein an average Boron concentration of the entire CoFeB body is at least 25%.

23. The method of claim 19, wherein the CoFeB body includes the first region and a second region, wherein the first average Boron concentration is at least 25% more than a second average Boron concentration of a second region of the CoFeB body.

24. The method of claim 23, wherein the first average Boron concentration is at least 50% more than the second average Boron concentration.

25. The method of claim 19, wherein a Boron concentration gradient of the CoFeB body varies along a thickness of the free magnetic layer.

* * * * *